US011012053B2

(12) United States Patent
Schiek et al.

(10) Patent No.: US 11,012,053 B2
(45) Date of Patent: May 18, 2021

(54) BAW RESONATOR AND RESONATOR ARRANGEMENT

(71) Applicant: SNAPTRACK, INC., San Diego, CA (US)

(72) Inventors: Maximilian Schiek, Munich (DE); Gilles Moulard, Munich (DE); Monika Schmiedgen, Olching (DE); Andre Schwobel, Munich (DE)

(73) Assignee: Snaptrack, Inc., San Diego, CA (US)

( * ) Notice: Subject to any disclaimer, the term of this patent is extended or adjusted under 35 U.S.C. 154(b) by 0 days.

(21) Appl. No.: 16/468,225

(22) PCT Filed: Dec. 1, 2017

(86) PCT No.: PCT/US2017/064253
§ 371 (c)(1),
(2) Date: Jun. 10, 2019

(87) PCT Pub. No.: WO2018/125516
PCT Pub. Date: Jul. 5, 2018

(65) Prior Publication Data
US 2020/0014368 A1 Jan. 9, 2020

(30) Foreign Application Priority Data
Dec. 29, 2016 (DE) ............... 10 2016 125 877.6

(51) Int. Cl.
*H03H 9/54* (2006.01)
*H03H 9/02* (2006.01)
*H03H 9/64* (2006.01)

(52) U.S. Cl.
CPC ...... *H03H 9/6469* (2013.01); *H03H 9/02157* (2013.01); *H03H 9/54* (2013.01)

(58) Field of Classification Search
CPC .. H03H 9/64; H03H 9/02; H03H 9/54; H03H 9/174

USPC ........................................................ 333/187
See application file for complete search history.

(56) References Cited

U.S. PATENT DOCUMENTS

| 6,107,721 A * | 8/2000 | Lakin ............... H03H 9/564 310/321 |
| 6,828,713 B2 * | 12/2004 | Bradley ............ H03H 3/02 29/25.35 |
| 6,933,809 B2 * | 8/2005 | Kyoung ............ H03H 3/02 333/187 |

(Continued)

FOREIGN PATENT DOCUMENTS

| WO | 2010004534 A1 | 1/2010 |
| WO | 2010100148 A1 | 9/2010 |

OTHER PUBLICATIONS

International Search Report and Written Opinion—PCT/US2017/064253—ISA/EPO—dated Mar. 9, 2018.
Taiwan Search Report—TW106142346—TIPO—dated Dec. 3, 2020.

*Primary Examiner* — Dan O Takaoka

(57) ABSTRACT

A filter comprising first and second BAW resonators. The first BAW resonator having a piezoelectric layer, located between a top electrode and a bottom electrode, and a dielectric layer located between the bottom electrode and an additional electrode. Wherein the dielectric layer, the bottom electrode and the additional electrode are configured to provide an additional capacitance in the resonator. The second BAW resonator having at least one less electrode than the first BAW resonator.

11 Claims, 4 Drawing Sheets

(56) References Cited

U.S. PATENT DOCUMENTS

| | | | |
|---|---|---|---|
| 8,098,118 B2* | 1/2012 | Suwa | H01P 1/203 |
| | | | 333/191 |
| 9,595,939 B2 | 3/2017 | Link et al. | |
| 2006/0164183 A1* | 7/2006 | Tikka | H03H 9/583 |
| | | | 333/133 |
| 2011/0304412 A1* | 12/2011 | Zhang | H03H 9/174 |
| | | | 333/187 |
| 2012/0056694 A1* | 3/2012 | Pang | H03H 9/175 |
| | | | 333/187 |
| 2014/0085020 A1 | 3/2014 | Reinhardt et al. | |
| 2015/0221442 A1 | 8/2015 | Link et al. | |
| 2017/0201235 A1* | 7/2017 | Freisleben | H03H 9/6483 |

* cited by examiner

BAW RESONATOR AND RESONATOR ARRANGEMENT

CROSS REFERENCE TO RELATED APPLICATION

This application is a national stage application under 35 U.S.C. § 371 of PCT/US2017/064253, filed Dec. 1, 2017, which claims priority to German Patent Application No. 102016125877.6, filed Dec. 29, 2016, which are incorporated herein by reference in their entirety for all applicable purposes.

BRIEF SUMMARY OF THE INVENTION

The present invention relates to a BAW (bulk acoustic wave) resonator, in particular to a SMR (solidly mounted resonator)-BAW resonator. Such a resonator may be used in an RF filter for a mobile phone, for example.

Document US 2015/333248 A1 discloses a BAW-SMR resonator. Document EP 1 221 770 A1 discloses a ladder-type filter comprising a shunt resonator and a series resonator.

In order to generate or shift electromagnetic and/or acoustic poles in micro-acoustic components such as resonators, bandpass filters and notch filters, capacitances and inductances are provided. For reasons of space, cost and quality, realizing these functionalities directly in the components is preferred to providing separate components. However, "on-chip" capacitances often require additional space, which leads to an overall increase of size of the components.

It is an object of the present invention to provide an improved BAW resonator.

In one aspect, the present invention relates to a BAW resonator comprising a piezoelectric layer located between a top electrode and a bottom electrode. Additionally, the BAW resonator comprises a dielectric layer located between the bottom electrode and an additional electrode. The dielectric layer, the bottom electrode and the additional electrode are configured to provide an additional capacitance in the resonator.

In particular, the dielectric layer is located below the piezoelectric layer and below the bottom electrode. The dielectric layer may provide the function of a seed layer for improving the growth conditions of the piezoelectric layer, passed on by the bottom electrode. In particular, the bottom electrode may be located directly on the seed layer. The piezoelectric layer may be located directly on the bottom electrode.

The dielectric layer comprises a dielectric material. The dielectric material may be a non-piezoelectric material. In case of a non-piezoelectric material, the resonator functionality is not influenced by the dielectric material.

In an alternative embodiment, the dielectric layer comprises a piezoelectric material. As an example, a suitable dielectric piezoelectric material may be AlN. The material used for the dielectric layer may be the same material as used for the piezoelectric material. Alternatively, different materials may be used for the dielectric and piezoelectric layers.

The dielectric material may have a high relative dielectric permittivity. As an example, the permittivity may be in the range of 10. Thereby, required capacitance values, e.g. in the range of several pF, can be achieved with small additional space.

The dielectric layer may have a significantly smaller thickness than the piezoelectric layer. As an example, the thickness of the dielectric layer may be at least one order of magnitude smaller than the thickness of the piezoelectric layer. The dielectric layer may have a thickness of less than 100 nm. Due to the small thickness, the space required for the additional electrode is small. The dielectric layer may be applied by sputtering. In case of a piezoelectric material used for the dielectric layer, the small thickness of the dielectric layer leads to a high resonance frequency of the dielectric layer, which does not disturb the operational resonance of the resonator.

In an embodiment, the additional electrode covers a smaller cross sectional area of the resonator than the bottom electrode. In this case, the resonator may have a first region in which the bottom electrode overlaps with the additional electrode and a second region in which the bottom electrode does not overlap with the additional electrode. In this case, a decoupling of the capacitance from the resonator functionality may be achieved. However, the first region may also contribute to the resonator functionality.

In an alternative embodiment, the additional electrode covers the same cross sectional area of the resonator as the bottom electrode. In this case, the additional electrode may completely overlap with the bottom electrode. The additional capacitance may be provided in the same vertical region as the resonator functionality.

In an embodiment, the top electrode does not or not fully cover the additional electrode. In this case, the region above the additional electrode does not or to a lower amount contribute to the resonator functionality. Thereby, a decoupling between the capacitance and the resonator functionality can be achieved.

In an embodiment, the additional capacitance may be located in or below an unused region of the chip, in particular, in a region not contributing to the resonator functionality. Such an unused region may be a region below a via, bump or other electrode leads.

The BAW resonator may further comprise a sequence of layers for providing a Bragg reflector. The additional electrode may be located directly on the uppermost layer of the Bragg reflector. In an embodiment, a further seed layer may be located between the uppermost layer and the additional electrode.

According to a further aspect of the present invention, a resonator arrangement comprising the previously described BAW resonator and a further BAW resonator is disclosed. The resonators may be electrically connected in a ladder-type manner. The BAW resonator may be a series resonator. The further resonator may be a shunt resonator.

The BAW resonator and the further BAW resonator may be located on a single substrate. The layers of the further BAW resonator may be formed in the same processing steps as the corresponding layers of the BAW resonator.

The dielectric layer of the BAW resonator may comprise a piezoelectric material. The further BAW resonator may comprise a first piezoelectric layer and a second piezoelectric layer. The first piezoelectric layer may have the same material and thickness as the piezoelectric layer of the BAW resonator. The second piezoelectric layer may have the same material and thickness as the dielectric layer of the BAW resonator. The first and second piezoelectric layers of the further BAW resonator may be directly adjacent to each other. Accordingly, the BAW resonator may comprise a piezoelectric layer, being composed of the first and second piezoelectric layers, wherein the piezoelectric layer corresponds to the sum of the piezoelectric layer and the dielectric layer in the BAW resonator.

The second piezoelectric layer may provide a shift of resonance frequencies between the BAW resonator and the further BAW resonator. The thickness of the second piezoelectric layer may define the shift of resonance frequencies.

In an embodiment, the BAW resonator and the further BAW resonator may have the same design except from the additional electrode. In particular, the sequence of layers, the material of the layers and the thicknesses of the layers may be the same in the two BAW resonators, except from the additional electrode which is only present in the BAW resonator and not in the further BAW resonator.

The resonator and/or resonator arrangement may be used in a BAW filter, such as an RF filter. The resonator, resonator arrangement and/or may comprise several of the above described capacitances, e.g. cascading capacitances.

According to a further aspect of the present invention, a method for manufacturing the above described filter arrangement is disclosed. The method comprises the step of providing one or more substrates for the BAW resonator and the further BAW resonator. In particular, a single substrate may be provided. A Bragg reflector may be formed on the substrate. The method may further comprise the step of forming an electrode layer for providing a bottom electrode for the further BAW resonator and an additional electrode for the BAW resonator above the substrate.

Furthermore, a dielectric layer is formed in a region for the BAW resonator and in a region for the further BAW resonator. Then, a bottom electrode is formed on the dielectric layer only in a region for the BAW resonator. By the dielectric layer, an additional capacitance is formed in the BAW resonator. Furthermore, a frequency shift can be accomplished in the further BAW resonator. Furthermore, a piezoelectric layer and a top electrode is formed for the BAW resonator and the further BAW resonator.

The present disclosure comprises several aspects of an invention. Every feature described with respect to the BAW resonator, the resonator arrangement and/or method is also disclosed herein with respect to the other aspect, even if the respective feature is not explicitly mentioned in the context of the specific aspect.

Further features, refinements and expediencies become apparent from the following description of the exemplary embodiments in connection with the schematic figures.

BRIEF DESCRIPTION OF THE SEVERAL VIEWS OF THE DRAWINGS

Similar elements, elements of the same kind and identically acting elements may be provided with the same reference numerals in the figures.

FIG. 1 shows a resonator 1 in a schematic section view. The resonator 1 is a BAW-SMR resonator.

DETAILED DESCRIPTION OF THE INVENTION

Figure 1:
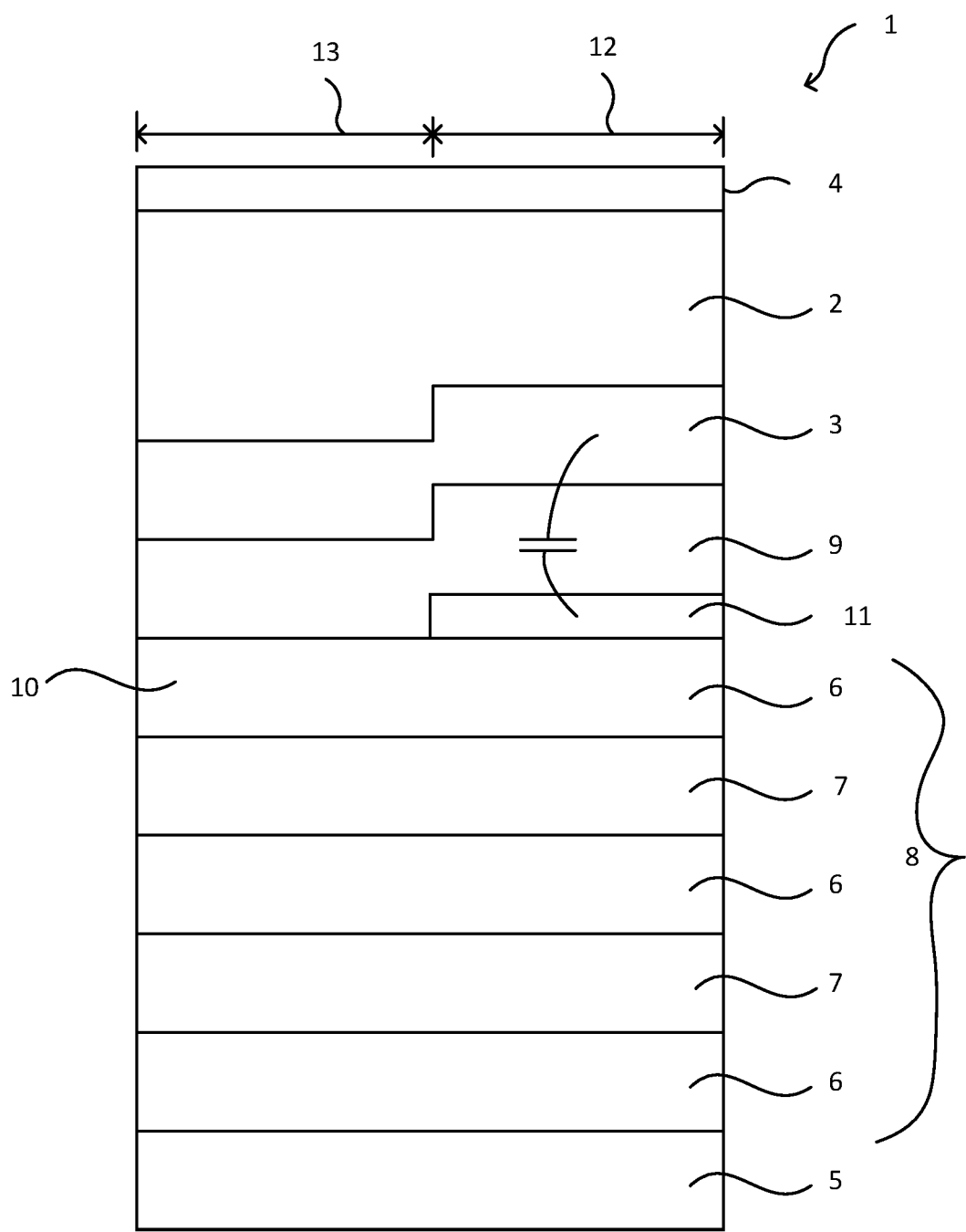
FIG. 1 shows an embodiment of a BAW resonator in a schematic sectional view.

The resonator 1 comprises a piezoelectric layer 2 being located between a bottom electrode 3 and a top electrode 4. By an electric signal, a standing acoustic wave is generated in the piezoelectric layer.

The piezoelectric layer 2 and the electrodes 3, 4 are located above a substrate 5. A sequence of layers 6 of low acoustic impedance and layers 7 of high acoustic impedance are provided in alternating order. The sequence of layers 6, 7 provides a Bragg reflector 8. Each of the layers 6, 7 has a thickness of about $\lambda/4$ for achieving an optimum of reflectivity for an acoustic wave of the wave length $\lambda$ at resonance of the entire resonator 1. As an example, the layers 6 of low acoustic impedance may comprise a dielectric material, such as $SiO_2$. The layers of high acoustic impedance may comprise a metal, such as tungsten (W).

The resonator 1 further comprises a dielectric layer 9. The dielectric layer 9 is located between the bottom electrode 3 and the uppermost layer 10 of the Bragg reflector 8. The bottom electrode 3 may be applied directly on the dielectric layer 9. The dielectric layer 9 is a seed layer and, thus, enables fabricating the piezoelectric layer 2 with improved quality. In particular, the dielectric layer 9 improves the uniformity of the bottom electrode 3 and, thereby, improves the growth conditions of the piezoelectric layer 2.

The dielectric layer 9 may be a thin layer, in particular a layer having a thickness below 100 nm. The dielectric layer 9 may be applied by sputtering, for example. The dielectric layer 9 may comprise a dielectric and/or piezoelectric material. As an example, the dielectric layer 8 may comprise Aluminum Nitride (AlN).

In addition to improving the growth conditions, the dielectric layer 9 provides an additional capacitance. For this aim, the resonator 1 comprises an additional electrode 11, which is located between the uppermost layer 10 of the sequence of layers 6, 7 and the dielectric layer 9. In this case, the additional capacitance is formed by the additional electrode 11, the dielectric layer 9 and the bottom electrode 3. The additional capacitance is indicated in the figure by a capacitance symbol.

The additional electrode 11 covers a smaller cross-sectional area of the resonator 1 than the bottom electrode 3. The additional electrode covers only a partial region of the uppermost layer 10 of the Bragg reflector 8. The dielectric layer 9 may be directly applied on the uppermost layer 10 of the Bragg reflector 8 in a region which is not covered by the additional electrode 11.

Due to the partial coverage of the additional electrode 11, the resonator 1 comprises a first region 12, in which the additional electrode 11 overlaps with the bottom electrode 3, and a second region 13, in which the additional electrode 11 is not present and, therefore, does not overlap with the bottom electrode 3.

The size of the overlap area of the additional electrode 11 and the bottom electrode 3 together with the thickness and material of the dielectric layer 9 determines the capacity of the additional capacitance. When the thickness and material of the dielectric layer 9 is specified, the size of the additional electrode 11 and, thereby, the overlap area is chosen such that a desired capacity value is achieved.

The top electrode 4 covers the complete cross-sectional area of the resonator 1 and completely overlaps with the bottom electrode 3. In other words, the top electrode 4 covers the same cross-sectional area as the bottom electrode 3. In this case, the first region 12 also provides a resonator function.

Due to the increase of mass load by the additional electrode 11, the resonance frequency in the first region 12 may be lower than in the second region 13. The thickness of the piezoelectric layer 2 in the first region 12 is approximately the same as in the second region 13. The step depicted in the figure in the piezoelectric layer 2 does not indicate a difference in thickness of the piezoelectric layer 2 in different regions but only illustrates that the piezoelectric layer 2 is located over the additional electrode 11.

In a further embodiment, the top electrode 4 covers a smaller cross-sectional area than the bottom electrode 3. In particular, the top electrode 4 may not extent in the first region 12 or may not fully cover the additional electrode 11. In this case, the first region 12 is not excited by an electrical field or only parts of the first region 12 are excited by an electrical field. Accordingly, the first region 12 does not contribute to the resonator function or contributes to a small amount to the resonator function.

In this case, the resonance frequency and the operating mode of the resonator may be decoupled from the realization and dimensioning of the additional capacitance.

The electrical connection of the electrodes 3, 4, 11 depends on the specific filter design. As an example, the additional capacitance, provided by the additional electrode 11, the dielectric layer 9 and the bottom electrode 3, may be electrically connected in parallel to the resonator, provided by the top electrode 14, the piezoelectric layer 2 and the bottom electrode 3.

The additional capacitance may be designed such that the surface area of the resonator 1 is not increased. As examples, the additional capacitance may be located in an unused region of the chip. Such an unused region may be a region below a via, bump or other electrode leads.

Figure 2:
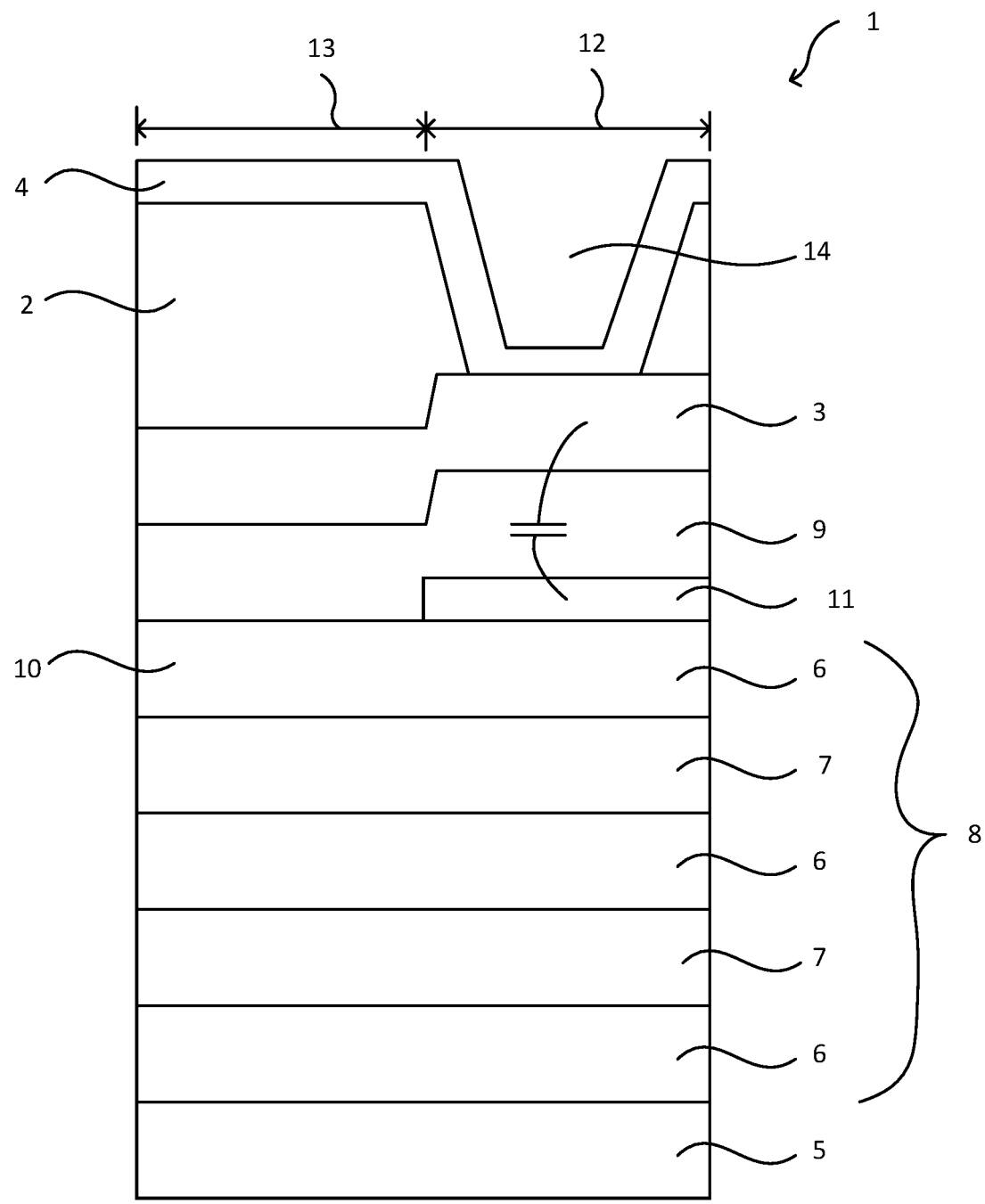
FIG. 2 shows a further embodiment of a BAW resonator in a schematic sectional view.

FIG. 2 shows a further embodiment of a resonator 1, wherein an additional capacitance is located below a via 14.

The via 14 leads through the piezoelectric layer 2 such that this region does not contribute to the resonator functionality. The additional electrode 11 is located below the via 14. The additional electrode 11 may cover approximately the same area as the via 14. In this case, the space used for the via 14 is optimally used for providing the additional electrode 11 without that the additional electrode 11 interferes with the normal resonator function.

The via 14 may electrically contact the bottom electrode 3 and may be electrically separated from the top electrode 4. The separation may be accomplished by photolithography, for example (not shown in the figure).

Figure 3:
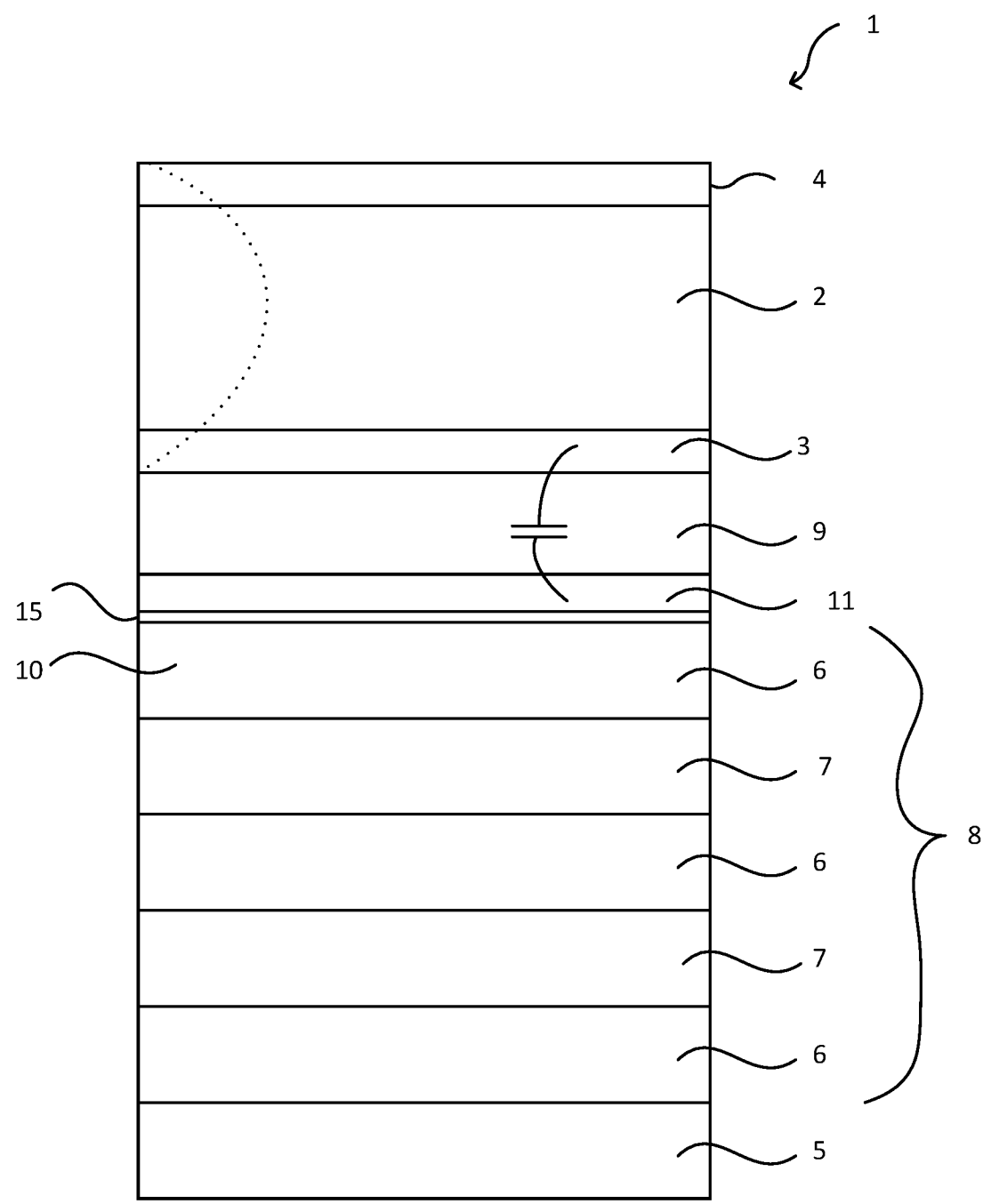
FIG. 3 shows a further embodiment of a BAW resonator in a schematic sectional view.

FIG. 3 shows a further embodiment of a resonator 1. The additional electrode 11 covers the same cross-sectional area as the bottom electrode 3 and, thus, entirely overlaps with the bottom electrode 3.

The dielectric layer 9 may comprise a piezoelectric material. The dielectric layer 9 may comprise the same piezoelectric material as the piezoelectric layer 2 which provides the resonator function. Alternatively, the dielectric layer 9 may comprise a different piezoelectric material than the piezoelectric layer 2 which provides the resonator functionality. Accordingly, in this embodiment, an additional capacitance is provided below the resonator functionality and decoupled from the resonator functionality.

The dielectric layer 9 may have a significantly smaller thickness than the piezoelectric layer 2. In particular, the thickness may be at least an order of a magnitude smaller than the thickness of the piezoelectric layer 2. In this case, resonance frequencies provided by the additional capacitance are far beyond the resonances of the operational range of the resonator 1. Accordingly, the resonance of the additional capacitance dos not interfere with the operational resonance of the resonator 1. The distribution of stress in the resonator 1 is indicated by a dashed line.

In addition to that, the resonator 1 may comprise a further seed layer 15 on top of the Bragg reflector 8. The further seed layer 15 improves the growth conditions of the piezoelectric layer 2 and the dielectric layer 9.

Figure 4:
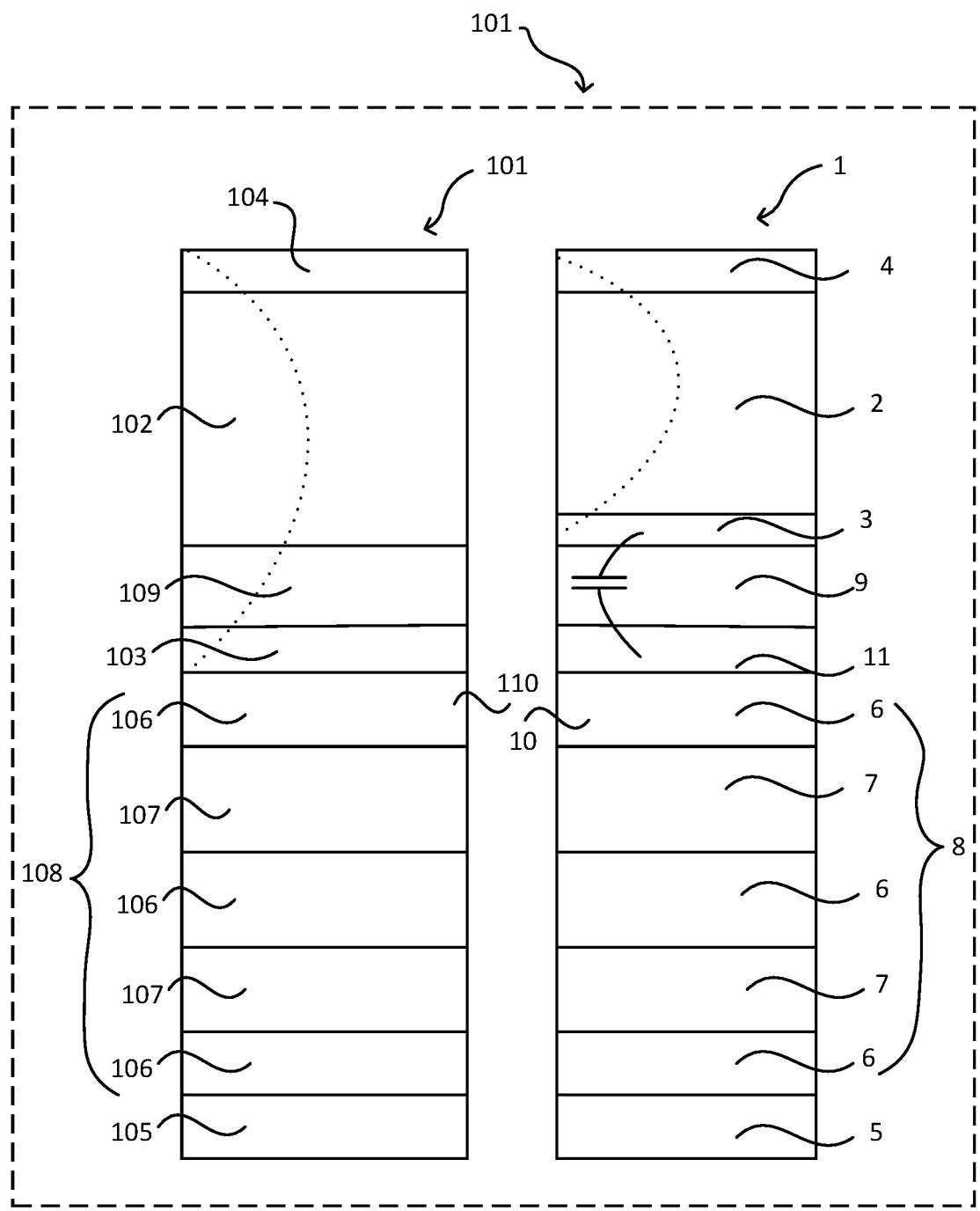
FIG. 4 shows an embodiment of a resonator arrangement in a schematic sectional view.

FIG. 4 shows an embodiment of a resonator arrangement 100 comprising a resonator 1 with an additional capacitance. The resonator 1 may have the structure of the resonator 1 shown in FIG. 3.

The resonator arrangement 100 comprises a further resonator 101. The resonator 1 and the further resonator 101 may be connected in a ladder-type manner. The resonator 1 may be a series resonator. The further resonator 101 may be a shunt resonator. The resonator arrangement 100 may be used in a ladder-type bandpass filter.

The further resonator 101 has a similar structure as the resonator 1, except from the additional capacitance which is not present in the further resonator 101. The further resonator 101 comprises a substrate 105 on which layers 106 of low acoustic impedance and layers 107 of high acoustic impedance are arranged in alternating manner to provide a Bragg reflector 108.

The further resonator 101 comprises a bottom electrode 103 and a top electrode 104 for generating an electric field and exciting a standing acoustic wave. Two piezoelectric layers 102, 109 are located between the electrodes 103, 104. The piezoelectric layers 102, 109 may comprise the same material or different materials. The piezoelectric layers 102, 109 directly adjoin to each other. The first piezoelectric layer 102 of the resonator 101 has the same thickness and the same material as the piezoelectric layer 2 of the resonator 1. Furthermore, the second piezoelectric layer 109 of the further resonator has the same thickness and the same material as the dielectric layer 9 of the resonator 1.

Due to the increased thickness of the piezoelectric material provided by the layers 102, 109 between the electrodes 103, 104 the resonance frequency of the further resonator 101 is deeper than the resonance frequency of the resonator 1, which has only the single piezoelectric layer 2. Accordingly, the second piezoelectric layer 109 provides a shift of resonance frequencies between the two types of resonators 1 and 101 in a filter arrangement. The thickness of the second piezoelectric layer 109 defines the shift of resonance frequencies. Accordingly, the piezoelectric layer 109 acts as a tuning layer for lowering the frequency of the further resonator 101 compared to the resonator 1.

In addition to that, the dielectric layer 9 of the resonator 1, corresponding to the second piezoelectric layer 109 of the further resonator 101, establishes an additional capacitance located below the resonator functionality of the resonator 1. Furthermore, the second piezoelectric layer 109 and the dielectric layer 9 serve as seed layers for an oriented growth of the main piezoelectric layers 2, 102. In the resonator 1, the oriented growth is passed on by the bottom electrode 3.

The further resonator 101 and the resonator 1 may be fabricated in the same process. One or more substrates may be provided for forming the substrates 5, 105 of the resonator 1 and the further resonator 101. The further resonator 101 and the resonator 1 may be located on the same substrate. In other words, the substrates 5, 105 may be the same substrate or may be different regions of a single substrate.

Then, the Bragg reflector layers 6, 106 of low acoustic impedance and the Bragg reflector layers 7, 107 of high acoustic impedance are deposited in alternating order. The layers 6, 7 of the resonator 1 and the layers 106, 107 of the further resonator 101 may be applied in a single process. A gap for decoupling the resonator 1 from the further resonator 101 may be provided by applying a mask. On the uppermost layers 10, 110 seed layers may be deposited, in particular in a single process.

On the seed layers or directly on the uppermost layers 10, 110 an electrode layer for providing the additional electrode 11 and the bottom electrode 103 is formed. On the electrodes 11, 103, a piezoelectric layer for providing the second piezoelectric layer 109 of the further resonator 101 and the dielectric layer 9 of the additional capacitance of the resonator 1 is deposited. An electrode layer for providing the bottom electrode 3 of the resonator 1 is provided only in the region of the resonator 1 and not in the region of the further resonator 101. As an example, the electrode layer may be deposited in a first step in the region of the resonator 1 and in the region of the further resonator 101. In a subsequent step, the electrode layer is selectively removed in the region of the further resonator 101 by photolithography, for example, such that only the bottom electrode 3 of the resonator 1 remains.

After that, a piezoelectric layer for providing the first piezoelectric layer 102 of the further resonator 101 and for providing the piezoelectric layer 2 of the resonator 1 is grown. On these piezoelectric layers 2, 102, an electrode layer for providing the top electrodes 4, 104 is formed.

REFERENCE NUMERALS 1 resonator
2 piezoelectric layer
3 bottom electrode
4 top electrode
5 substrate
6 layer of low acoustic impedance
7 layer of high acoustic impedance
8 Bragg reflector
9 dielectric layer
10 uppermost layer
11 additional electrode
12 first region
13 second region
14 via
15 further seed layer
100 resonator arrangement
101 further resonator
102 first piezoelectric layer
103 bottom electrode
104 top electrode
105 substrate
106 layer of low acoustic impedance
107 layer of high acoustic impedance
108 Bragg reflector
109 second piezoelectric layer
110 uppermost layer

The invention claimed is:

1. A filter comprising:
a first BAW resonator having a piezoelectric layer located between a top electrode and a bottom electrode and a dielectric layer located between the bottom electrode and an additional electrode, wherein the dielectric layer, the bottom electrode and the additional electrode are configured to provide capacitance in the resonator;
a second BAW resonator with at least one less electrode than the first BAW resonator.

2. A filter, according to, claim 1, wherein the dielectric layer is a seed layer for improving the growth conditions of the piezoelectric layer.

3. A filter, according to claim 1, wherein the thickness of the dielectric layer is at least one order of magnitude smaller than the thickness of the piezoelectric layer.

4. A filter, according to claim 1, wherein the dielectric layer comprises a non-piezoelectric material.

5. A filter, according to claim 1, wherein the dielectric layer comprises a piezoelectric material.

6. A filter, according to claim 1, wherein the additional electrode covers a smaller cross-sectional area of the resonator than the bottom electrode.

7. A filter, according to claim 1, wherein the additional electrode covers the same cross-sectional area of the resonator as the bottom electrode.

8. A filter, according to claim 1, wherein the top electrode does not or not fully cover the additional electrode.

9. A filter, according to claim 1, further comprising a via, wherein the additional electrode is located below the via.

10. A filter, according to claim 1, wherein the dielectric layer comprises a piezoelectric material and wherein the second BAW resonator comprises a second piezoelectric layer and a third piezoelectric layer adjacent to the second piezoelectric layer and, wherein the third piezoelectric layer has the same thickness and material as the dielectric layer.

11. A filter, according to claim 1, wherein the first BAW resonator and the second BAW resonator are located on a single substrate.

* * * * *